US010305272B2

(12) United States Patent
Shi et al.

(10) Patent No.: US 10,305,272 B2
(45) Date of Patent: May 28, 2019

(54) APPARATUS AND METHOD FOR DETECTING DISCONNECTION IN SECONDARY SIDE OF CURRENT TRANSFORMER

(71) Applicant: NXP USA, INC., Austin, TX (US)

(72) Inventors: Changhao Shi, Suzhou (CN); Rui Lv, Suzhou (CN); Dechang Wang, Suzhou (CN)

(73) Assignee: NXP USA, INC., Austin, TX (US)

( * ) Notice: Subject to any disclaimer, the term of this patent is extended or adjusted under 35 U.S.C. 154(b) by 299 days.

(21) Appl. No.: 15/462,913

(22) Filed: Mar. 20, 2017

(65) Prior Publication Data

US 2018/0261999 A1 Sep. 13, 2018

(30) Foreign Application Priority Data

Mar. 10, 2017 (CN) .......................... 2017 1 0144145

(51) Int. Cl.
*H02H 3/20* (2006.01)
*H02H 7/04* (2006.01)
(Continued)

(52) U.S. Cl.
CPC .......... *H02H 7/042* (2013.01); *G01R 31/027* (2013.01); *H02H 3/20* (2013.01); *H02H 7/045* (2013.01); *G01R 31/04* (2013.01)

(58) Field of Classification Search
CPC .......... H02H 3/20; H02H 7/042; H02H 7/045; G01R 31/027; G01R 31/04
(Continued)

(56) References Cited

U.S. PATENT DOCUMENTS 5,563,506 A   10/1996 Fielden et al.
7,359,809 B2   4/2008 Bruno
(Continued)

FOREIGN PATENT DOCUMENTS

CN   101512861 A   8/2009
CN   102478614 A   5/2012
(Continued)

OTHER PUBLICATIONS

Machine translation of Noda et al. Japanese Patent Document JP H06-188076 Jul. 8, 1994 (Year: 1994).*
(Continued)

*Primary Examiner* — Kevin J Comber
(74) *Attorney, Agent, or Firm* — Charles E. Bergere

(57) ABSTRACT

An apparatus for detecting disconnection of a secondary side of a current transformer includes a sampling circuit coupled to the secondary side of the current transformer that samples signals from the secondary side of the current transformer. A pull-up circuit is switchably coupled to the sampling circuit in response to a coupling signal in a diagnostic phase. A processor is coupled to the sampling circuit for receiving sampled signals from the sampling circuit. The processor extracts corresponding signal information from the sampled signals and stores the extracted signal information in a memory. The extracted signal information corresponds to statuses that the secondary side of the current transformer is connected or disconnected to a load. A detector is coupled to the processor and the memory, and accesses the memory using the signal information of the sampled signals.

13 Claims, 2 Drawing Sheets

(51) Int. Cl.
*G01R 31/02* (2006.01)
*G01R 31/04* (2006.01)
*H02H 7/045* (2006.01)

(58) Field of Classification Search
USPC .......................................................... 361/36
See application file for complete search history.

(56) References Cited

U.S. PATENT DOCUMENTS

| | | |
|---|---|---|
| 7,928,722 B2 | 4/2011 | Wallis |
| 8,073,642 B2 | 12/2011 | Slota et al. |
| 9,354,258 B2 | 5/2016 | Ryochi et al. |
| 9,410,552 B2 | 8/2016 | Pierson |
| 2018/0278041 A1* | 9/2018 | Oda ........................ H02H 3/044 |

FOREIGN PATENT DOCUMENTS

| | | | | |
|---|---|---|---|---|
| JP | 06188076 | A | * | 7/1994 |
| JP | 11205998 | A | * | 7/1999 |

OTHER PUBLICATIONS

Machine translation of Kinoshita Japanese Patent Document JP H11-205998 Jul. 30, 1999 (Year: 1999).*

* cited by examiner

APPARATUS AND METHOD FOR DETECTING DISCONNECTION IN SECONDARY SIDE OF CURRENT TRANSFORMER

BACKGROUND

The present invention generally relates to an apparatus and method for detecting disconnection in a secondary side of a current transformer, and, more particularly, to a circuit and method that monitor the secondary side voltage of a transformer to determine if the secondary side is disconnected.

Current transformers (CT) typically are used in power applications such as power meters. A CT detects electric currents in a wire, and generates a signal proportional to the current. In power applications, the current in the primary side is too large to be safely measured. The CT can be used for generating a much lower and proportional current on the secondary side, which is suitable for measurement or protection. Because the secondary side current is proportional to the primary side current, the measured secondary side current can be converted to reflect the primary side current using the equation $K_n = I_{1n}/I_{2n}$, wherein $K_n$ is a current ratio from the primary to the secondary, $I_{1n}$ is the primary side current, and $I_{2n}$ is the secondary side current. A CT thus provides safe electrical isolation.

A critical requirement for using a CT is that, when there is current in the primary side, the secondary side must be connected with a load instead of being open. If the secondary side is open, the primary side current will push the secondary voltage to an extremely high value, which can be harmful and dangerous.

It therefore would be advantageous to be able to detect if the secondary side of a CT is disconnected.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides an apparatus for detecting disconnection of a secondary side of a current transformer from a load. The apparatus includes a sampling circuit coupled to the secondary side of the current transformer for sampling signals from the secondary side of the current transformer, a pull-up circuit switchably coupled to the sampling circuit in response to a coupling signal when the current transformer is in a diagnostic phase, and a processor coupled to the sampling circuit for receiving the sampled signals from the sampling circuit. The processor extracts corresponding signal information from the sampled signals, where the extracted signal information corresponds to statuses of the secondary side of the current transformer being connected or disconnected to a load in a calibration phase of the current transformer. A memory is coupled to the processor for storing the extracted signal information, and a detector is coupled to the processor and the memory. The detector accesses the memory using the signal information of the sampled signals in the diagnostic phase to determine whether the extracted signal information matches the stored signal information in order to determine if the load has been disconnected from the current transformer.

In another embodiment, the present invention provides a method for detecting disconnection of a load from a secondary side of a current transformer. The method includes the steps of storing in a storage device first signal information of sampled signals corresponding to statuses that the secondary side of the current transformer is connected or disconnected with a load in a calibration phase, coupling a pull-up circuit with a sampling circuit in response to a coupling signal in a diagnostic phase, sampling signals from the secondary side of the current transformer in the diagnostic phase, extracting second signal information from the sampled signals, and accessing the storage device using the second signal information to determine if the load has been disconnected from the current transformer.

In yet another embodiment, the present invention provides a method for detecting disconnection of a load from a secondary side of a current transformer. The method comprises coupling a shifting circuit to a secondary side of the current transformer in response to the current transformer changing to a diagnostic phase, determining a signal voltage from the secondary side of the current transformer, and pairing the determined signal voltage with a corresponding status that indicates whether the secondary side of the current transformer is connected or disconnected to the load.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

The present invention provides a circuit and method for determining whether a load has been disconnected from a secondary side of a current transformer. In a calibration phase, typically performed at a factory, a pull-up circuit is coupled with a sampling circuit, and a load is connected and disconnected with the transformer, and signal information relating to voltage parameters thereof are stored in a memory. In normal operation, the pull-up circuit is disconnected from the sampling circuit, and a processor monitors the transformer (i.e., the load connected thereto) by extracting signal information received from the sampling circuit (which is connected to the transformer). If the processor detects an abnormal voltage fluctuation, then the transformer is placed in a diagnostic mode. In the diagnostic mode, the pull-up circuit is connected to the sampling circuit, and a detector, which receives current signal information from the processor, accesses the memory to check for matching signal information to determine whether the load is connected or disconnected from the transformer.

Figure 1:
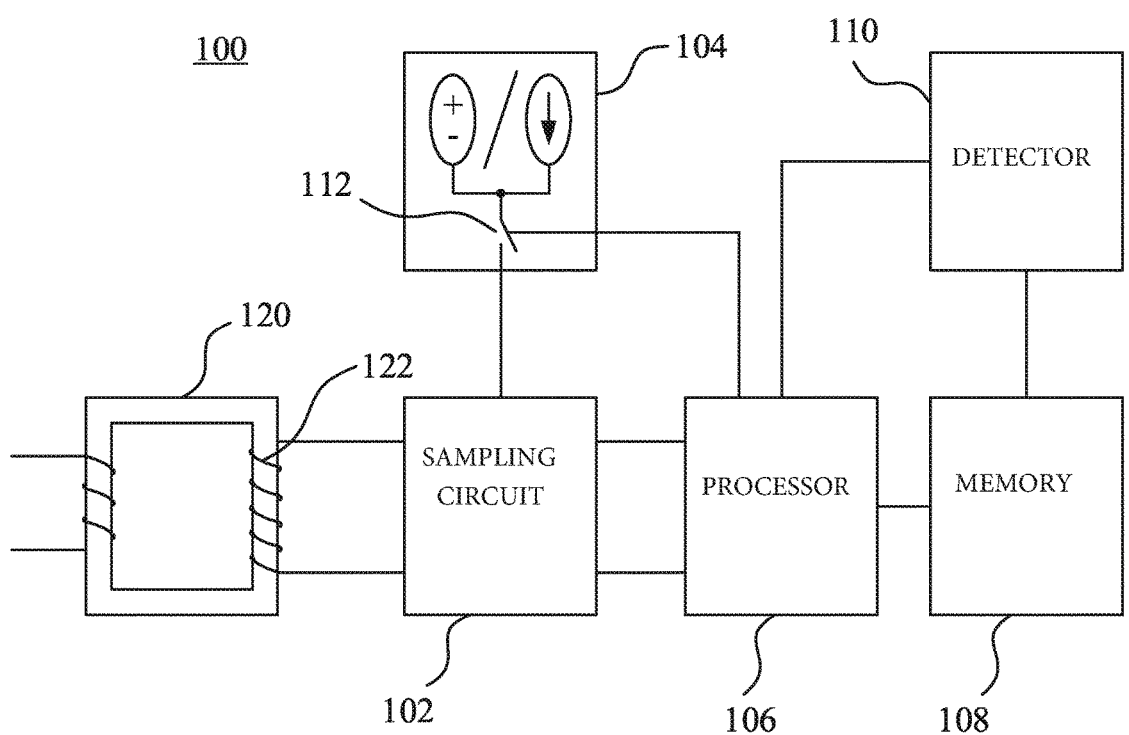
FIG. 1 is a schematic block diagram of an apparatus for detecting disconnection in a secondary side of a current transformer in accordance with an embodiment of the present invention.

Referring now to FIG. 1, which depicts an apparatus 100 for detecting disconnection of a load from a secondary side of a current transformer. The apparatus 100 includes a sampling circuit 102, a pull-up circuit 104, a processor 106, a memory or storage device 108, and a detector 110.

The sampling circuit 102 is coupled to a secondary side 122 of a current transformer (CT) 120. The sampling circuit 102 is configured to sample signals from a secondary side 122 of the CT 120. The pull-up circuit 104 is switchably coupled to the sampling circuit 102. In the presently preferred embodiment, a coupling signal is provided from the processor 106 to connect and/or disconnect the pull-up circuit 104 from the sampling circuit 102. The processor 106 is coupled to the sampling circuit 102 and receives the sampled signals from the sampling circuit 102. The processor 106 extracts corresponding signal information from the sampled signals. The signal information preferably comprises signal voltages.

The storage device 108 is coupled to the processor 106 and stores the signal information of the sampled signals. While the storage device 108 is shown as being separate from the processor 106, in a preferred embodiment the storage device 108 comprises a memory integrated in or that is part of the processor 106. Typically, the signal information extracted from the sampled signals corresponds with a related status of the CT 120, e.g., if the secondary side 122 is connected or disconnected from the load. Accordingly, the storage device 108 stores the status, which is paired with the corresponding signal information. More particularly, the stored signal information is a voltage range of the sampled signals corresponding to the statuses that the secondary side 122 of the CT 120 is connected or disconnected from the load when the pull-up circuit 104 is coupled to the sampling circuit 102. The stored signal information is obtained during a calibration phase, for example in the factory, in which the pull-up circuit 104 is coupled with the sampling circuit 102.

The detector 110 is coupled to the processor 106 and the storage device 108. In a diagnostic phase in which an output of the secondary side 122 of the CT 120 experiences exceptional fluctuation, the pull-up circuit 104 is controlled with the coupling signal, which couples the pull-up circuit 104 with the sampling circuit 102. As noted above, in the current embodiment, the coupling signal is provided by the processor 106 to connect or disconnect the pull-up circuit 104 and the sampling circuit 102. In the diagnostic phase, the sampling circuit 102 samples the output signal from the secondary side 122 of the CT 120, and provides the sampled signal to the processor 106. The processor 106 extracts the signal information from the sampled signal, for example, a voltage of the sampled signal. The detector 110 looks up the signal information in the storage device 108 for corresponding paired status information.

During the calibration phase, the processor 106 provides the coupling signal to couple the pull-up circuit 104 with the sampling circuit 102, and in normal operational mode, the processor 106 provides the coupling signal to decouple the pull-up circuit 104 from the sampling circuit 102. In the diagnostic phase, as described above, the processor 106 provides the coupling signal for coupling the pull-up circuit 104 with the sampling circuit 102. Although it is described herein that the processor 106 provides the coupling signal, in alternative embodiments, the coupling signal can be provided by other control circuitry, such as a controller. In an embodiment, the processor 106 comprises an MPC5777 microprocessor, which is available from NXP Semiconductors B.V. of the Netherlands.

The pull-up circuit 104 includes a switching circuit 112. The switching circuit 112 is coupled with the processor 106 and the sampling circuit 102, and receives the coupling signal, which either opens or closes a switch, thereby connecting or disconnecting the pull-up circuit 104 and the sampling circuit 102. The switching circuit 112 can be located outside the pull-up circuit 104 in alternative embodiments.

Figure 2:
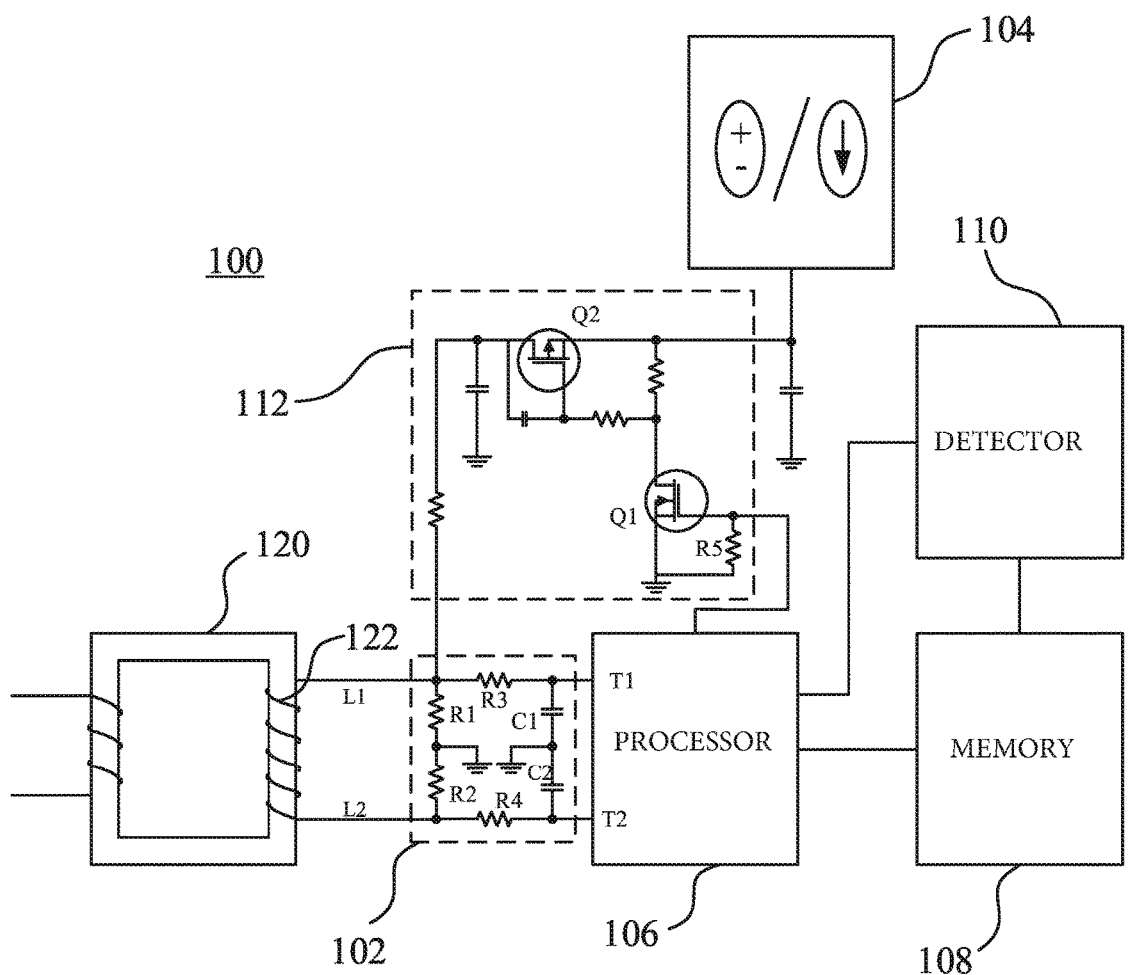
FIG. 2 is a more detailed schematic diagram of the apparatus of FIG. 1.

FIG. 2 is a more detailed circuit diagram of the apparatus 100 of FIG. 1. Referring now to FIG. 2, the sampling circuit 102 includes a first branch of serially connected first and second resistors R1 and R2, a second branch of serially connected capacitors C1 and C2, and resistors R3 and R4, which are respectively connected between each end of the first and second branches. The first branch is connected between tap leads L1 and L2 of the secondary winding 122 of the CT 120. In optional embodiments, the sampling circuit 102 can be implemented as an Active Front Ends (AFE). Each end of the second branch is coupled with an input terminal T1 and T2 of the processor 106, which allows the processor 106 to extract signal information from the sampled signals at each end L1 and L2 of the secondary winding 122.

The switching circuit 112 includes a first transistor Q1 and a second transistor Q2. A gate of the first transistor Q1 is connected to the processor 106 for receiving the coupling signal from the processor 106. A source of the first transistor Q1 is connected to ground, and a drain of the first transistor Q1 is connected to the gate of the second transistor Q2 through a resistor R5. The source of the second transistor Q2 is connected to the pull-up circuit 104, which can be a voltage source or current source, and the drain of the second transistor Q2 is connected to the tap lead L1 of the secondary winding 122 of the CT 120.

In the calibration phase, the processor 106 provides the coupling signal to the first transistor Q1. The switching circuit 112 accordingly couples the pull-up circuit 104 with the secondary winding 122. Subsequently, the secondary winding 122 is connected and disconnected, and the signal voltage of the secondary winding 122 is extracted by the processor 106 for both statuses. It will be understood by those of skill in the art that if the secondary winding 122 is disconnected from a load, due to the pull-up circuit 104 coupling to the tap lead L1, the signal voltage of the secondary winding 122 is shifted to be higher than that in the connected status. The resistances of the first and second resistors R1 and R2 can be properly configured based on applicable pull-up voltage, CT resistance value, etc., such that the offset voltage can be shifted to a distinguishable value.

Table 1 shows an example of signal voltages on input terminals T1 and T2 of the processor 106 when the pull-up circuit 104 is not coupled with the sampling circuit 102:

TABLE 1

Example Signal Voltages without Pull-up Circuit

| | Secondary Winding Connected | | Secondary Winding Disconnected | |
| --- | --- | --- | --- | --- |
| | Min (mV) | Max (mV) | Min (mV) | Max (mV) |
| T1 | 0.532984734 | 0.572919846 | 0.525832176 | 0.54949522 |
| T2 | 0.958740711 | 0.993967056 | 0.969946384 | 0.996828079 |

It can be seen from Table 1 that, in situations where the pull-up circuit 104 is not coupled to the sampling circuit 102, the voltages on the input terminals T1 and T2 of the processor 106 show no significant difference between connected and disconnected statuses. Thus, it is difficult to distinguish the connected status from the disconnected status using the sampled signal voltages.

Using a pull-up voltage of 3.3V as an example, Table 2 shows the signal voltages on input terminals T1 and T2 of the processor 106 when the pull-up circuit 104 is coupled with the sampling circuit 102.

TABLE 2

Signal voltage examples with pull-up circuit coupled

|  | Secondary Winding Connected | | Secondary Winding Disconnected | |
| --- | --- | --- | --- | --- |
|  | Min (mV) | Max (mV) | Min (mV) | Max (mV) |
| T1 | 10.27846336 | 10.39528847 | 10.78885794 | 10.85299253 |
| T2 | 10.69372892 | 10.75917482 | 11.22444868 | 11.26950979 |

From Table 2, it can be seen that the signal voltages on input terminals T1 and T2 changes significantly when the secondary winding 122 is connected and disconnected from the load. For example, the minimum signal voltage on the input terminal T1 increases from 10.27846336 mV when the secondary side 122 is connected to the load, to 10.78885794 mV when the secondary side 122 is disconnected from the load. Accordingly, the sampled signal voltages are distinctive enough to be distinguished from each other. In the calibration phase, when the pull-up circuit 104 is coupled to the sampling circuit 102, the sampled signal voltage is paired with a signal range like in the above Table 2, and a corresponding connection status can be determined.

During the calibration phase, the signals from the secondary side 122 of the CT 120 are sampled and measured multiple times, both with the connected status and the disconnected status, such that voltage ranges for each of the statuses are extracted and stored in the storage device 108.

The determination of the connection status of the secondary side 122 of the CT 120 is useful for determining malfunctions. If it is determined that the secondary side 122 is disconnected, then it is necessary to shut down the power supply to the primary side so that the voltage on the secondary side will not get too high to damage the CT 120.

In the diagnostic phase, the processor 106 provides the coupling signal to the switching circuit 112 for coupling the pull-up circuit 104 with the sampling circuit 102. The sampled signals are provided to the input terminals T1 and T2 of the processor 106. The detector 110 looks up the sampled signal voltages in the storage device 110 to find the voltage ranges that the sampled signal voltages are included within. More particularly, the detector 110 compares the signal information of the sampled signals in the diagnostic phase with the voltage ranges stored in the storage device 110, and determines the voltage range in which the signal information is included. The detector 110 can then determine the connection status corresponding to the found voltage range as the current connection status of the CT 120. Because the voltage ranges are shifted from each other amongst connected and disconnected statuses, it is easy to distinguish and find the target voltage range.

Further, to detect the above-described exceptional fluctuation and entering the diagnostic phase, the processor 106 can set a predetermined threshold for the change of sampling signals. If the change of the sampling signals from the secondary side 122 exceeds the threshold, then it is determined that there is an exceptional fluctuation, and subsequently the coupling signal is provided to the switching circuit 112 to couple the pull-up circuit 104 with the sampling circuit 102 in the diagnostic phase.

According to various embodiments, the coupling of the pull-up circuit 104 enlarges the difference between statuses that the secondary side 122 of the CT 120 is connected and disconnected from the load. In other words, the pull-up circuit 104 shifts the voltage ranges in each status so that they are spaced from each other, such that the extracted voltage range in the diagnostic phase can be readily paired with a stored voltage range. Since each of the voltage ranges has a corresponding status, it is easy to determine the connection status from the pairing of the extracted signal voltage.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for illustration only, and should not be used to limit the invention, as the scope of protection sought is defined by the claims set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. An apparatus for detecting disconnection of a secondary side of a current transformer, the apparatus comprising:
    a sampling circuit coupled to the secondary side of the current transformer for sampling signals from the secondary side of the current transformer;
    a pull-up circuit switchably coupled to the sampling circuit in response to a coupling signal when the current transformer is in a diagnostic phase;
    a processor coupled to the sampling circuit for receiving the sampled signals from the sampling circuit, wherein the processor extracts corresponding signal information from the sampled signals, wherein the extracted signal information corresponds to statuses of the secondary side of the current transformer being connected or disconnected to a load in a calibration phase of the current transformer;

a memory coupled to the processor for storing the extracted signal information; and a detector coupled to the processor and the memory, wherein the detector accesses the memory and uses the signal information of the sampled signals in the diagnostic phase to determine whether the extracted signal information matches stored predetermined signal information in order to determine if the load has been disconnected from the current transformer.

2. The apparatus of claim 1, wherein the processor stores the predetermined signal information when the current transformer is in a calibration phase, wherein in the calibration phase, the pull-up circuit is coupled to the sampling circuit.

3. The apparatus of claim 2, further comprising a controller in communication with the pull-up circuit for providing a coupling signal to the pull-up circuit to couple and decouple the pull-up circuit and the sampling circuit in the calibration phase.

4. The apparatus of claim 3, wherein the controller provides the coupling signal to the pull-up circuit to decouple the pull-up circuit from the sampling circuit in a normal operational phase of the current transformer.

5. The apparatus of claim 1, further comprising a controller connected to the pull-up circuit for providing coupling signals to the pull-up circuit to couple the pull-up circuit and the sampling circuit in the diagnostic phase.

6. The apparatus of claim 1, wherein the pull-up circuit comprises one of a voltage source and a current source.

7. The apparatus of claim 1, further comprising a switching circuit coupled between the pull-up circuit and the sampling circuit, wherein the switching circuit receives the coupling signal and couples or decouples the pull-up circuit from the sampling circuit in response thereto.

8. A method for detecting disconnection of a load from a secondary side of a current transformer, wherein the method comprises:

storing first signal information of sampled signals corresponding to statuses that the secondary side of the current transformer is connected or disconnected with a load in a calibration phase;

coupling a pull-up circuit with a sampling circuit in response to a coupling signal in a diagnostic phase;

sampling signals from the secondary side of the current transformer in the diagnostic phase;

extracting second signal information from the sampled signals; and accessing the storage device and using the first and second signal information to determine if the load has been disconnected from the current transformer.

9. The method of claim 8, wherein the step of storing the first signal information in the storage device comprises:

coupling the pull-up circuit with the sampling circuit in response to a coupling signal in the calibration phase;

sampling respective signals from the secondary side of the current transformer with a load connected and disconnected;

extracting the first signal information from the sampled signals in the calibration phase; and storing the extracted first signal information in the calibration phase.

10. The method of claim 8, further comprising:

decoupling the pull-up circuit from the sampling circuit during a normal operational phase of the current transformer.

11. The method of claim 8, wherein the stored first signal information comprises voltage ranges corresponding to statuses that the secondary side of the current transformer is connected and disconnected with a load; and wherein the step of accessing the storage device comprises:

comparing the second signal information with the voltage ranges;

determining a voltage range of the second signal information is included within; and determining whether the secondary side of the current transformer is connected or disconnected with a load based on the determined voltage range.

12. The method of claim 11, wherein the step of storing the first signal information in the storage device comprises:

coupling the pull-up circuit with the sampling circuit in response to a coupling signal in the calibration phase;

shifting the voltages of the sampled signals in the calibration phase respectively corresponding to the status that the secondary side of the current transformer is connected and disconnected with a load, through the coupling of the pull-up circuit; and storing, in the storage device, voltage ranges corresponding to the statuses that the secondary side of the current transformer is connected and disconnected with the load.

13. The method of claim 8, wherein the step of coupling the pull-up circuit with the sampling circuit in the diagnostic phase comprises:

detecting a change of the sampling signals from the secondary side of the current transformer;

determining if the change of the sampling signals exceeds a predetermined threshold; and providing the coupling signal for coupling the pull-up circuit to the sampling circuit in the calibration phase.

* * * * *